(12) United States Patent
Martin et al.

(10) Patent No.: US 7,287,678 B2
(45) Date of Patent: Oct. 30, 2007

(54) METHOD AND APPARATUS FOR DETERMINING AND SETTING MATERIAL RELEASE MECHANISM TIMING FOR A MATERIAL FEED MECHANISM

(75) Inventors: Vaughn H. Martin, Gibsonia, PA (US); Daniel G. Lukas, Pittsburgh, PA (US); Bryan P. Gentile, Pittsburgh, PA (US); Matthew C. Crowell, Delmont, PA (US)

(73) Assignee: Vamco International Inc., Pittsburgh, PA (US)

( * ) Notice: Subject to any disclaimer, the term of this patent is extended or adjusted under 35 U.S.C. 154(b) by 51 days.

(21) Appl. No.: 10/416,945

(22) PCT Filed: Nov. 16, 2001

(86) PCT No.: PCT/US01/43698

§ 371 (c)(1),
(2), (4) Date: Nov. 7, 2003

(87) PCT Pub. No.: WO02/45943

PCT Pub. Date: Jun. 13, 2002

(65) Prior Publication Data

US 2004/0069105 A1    Apr. 15, 2004

(51) Int. Cl.
B65H 20/04 (2006.01)
B26F 1/02 (2006.01)
B23Q 15/00 (2006.01)
(52) U.S. Cl. .............. 226/2; 83/30; 83/74; 226/33
(58) Field of Classification Search .......... 226/33, 226/57, 177, 2; 72/420, 421, 405.06, 404, 72/20.5; 83/62, 72, 76.7, 76.9, 222, 367, 83/418, 30, 74, 76

See application file for complete search history.

(56) References Cited

U.S. PATENT DOCUMENTS

| 1,607,528 | A | 11/1926 | Grover |
| 1,916,845 | A | 7/1933 | Leland |
| 2,095,125 | A | 10/1937 | Cornock |
| 2,722,276 | A | 11/1955 | Revelle |
| 3,556,368 | A | 1/1971 | Rene |
| 3,647,127 | A | 3/1972 | Wiig |
| 3,707,255 | A | 12/1972 | Ridgway et al. |

(Continued)

Primary Examiner—John Q. Nguyen
Assistant Examiner—Scott Haugland
(74) Attorney, Agent, or Firm—The Webb Law Firm

(57) ABSTRACT

This invention includes a method of determining the correct timing of a material release mechanism (42) of a material feed mechanism (14) and includes the steps of: cycling a press mechanism (12) through a working portion of a tooling mechanism (17); monitoring the press mechanism (12) position; determining, by a location device (58), the desired timing for the material release mechanism (42) to release contact with material (18); and correlating the desired material release mechanism (42) timing to the press mechanism (12) position. The present invention also is a stamping system (10) for working the material (18). This stamping system (10) includes a press mechanism (12) having a tooling mechanism (17) configured to punch holes (66) in the material (18). The stamping system (10) also includes a material feed mechanism (14) to feed material (18) to the press mechanism (12), and this material feed mechanism (14) includes a material release mechanism (42). Finally, the stamping system (10) includes a location device (58) to monitor the press mechanism (12) position and determine desired material release mechanism (42) timing.

5 Claims, 3 Drawing Sheets

U.S. PATENT DOCUMENTS

| | | |
|---|---|---|
| 3,713,571 A | 1/1973 | Simonton |
| 3,747,819 A | 7/1973 | Brandstrom |
| 4,135,084 A | 1/1979 | Ulin |
| 4,209,120 A | 6/1980 | Ruegg et al. |
| 4,420,107 A | 12/1983 | Seyffert et al. |
| 4,562,947 A | 1/1986 | Bishop et al. |
| 4,788,908 A | 12/1988 | Sugiyama et al. |
| 4,953,808 A | 9/1990 | Craycraft |
| 5,033,342 A | 7/1991 | Nordlof |
| 5,150,022 A | 9/1992 | Waddington |
| 5,310,105 A | 5/1994 | Mills |
| 5,470,300 A | 11/1995 | Terranova |
| 5,720,421 A | 2/1998 | Gentile et al. |
| 5,808,465 A | 9/1998 | Gentile et al. |
| 5,868,296 A | 2/1999 | Gentile et al. |
| 5,952,808 A | 9/1999 | Umeji |
| 6,179,189 B1 | 1/2001 | Otoshi |

METHOD AND APPARATUS FOR DETERMINING AND SETTING MATERIAL RELEASE MECHANISM TIMING FOR A MATERIAL FEED MECHANISM

BACKGROUND OF THE INVENTION

1. Field of the Invention

The present invention relates generally to stamping systems having material feed mechanisms and, in particular, to a method and apparatus for determining and setting a material release mechanism timing for a material feed mechanism.

2. Description of the Prior Art

Typically, parts made with an automated stamping press utilize a progressive die set. The progressive die set uses multiple stations, each station typically containing at least one punching or forming punch and a mating die or dies. Continuous strip material, from which the part will be made, is incrementally fed through the die set, progressing from station to station with an automated feeding device. A material feed mechanism intermittently moves the strip material a distance, corresponding to the distance between each die station, while the die set is open. This mechanism then stops the material at each station when the die set closes. Examples of prior art material feed mechanisms may be found in U.S. Pat. Nos. 5,755,370; 5,868,296; 5,915,293; and 5,808,465.

Alignment devices are commonly used in a progressive die set to position the strip in the die set for each subsequent operation more accurately than is possible with the material feed mechanism. The most commonly used and most easily understood alignment device is a tapered or beveled point pilot positioning pin or a plurality of such pins. The pilot positioning pin is mounted in the moving, usually the upper, die shoe. Typically, a hole of slightly larger diameter than the diameter of the pilot positioning pin is punched in the continuous strip material in a first station during the first closure of the die. The automated material feed mechanism then moves the material a predetermined distance corresponding to the distance between subsequent die stations. Upon subsequent die closures, the pilot positioning pin, which is longer in length than the working punches, enters the hole created by the punch and locates the material accurately.

Pilot positioning pins may be used at any number of subsequent die stations. In order for the pilot positioning pin, or other alignment device, to effectively position the material accurately, the material feed mechanism must relinquish its grip on the strip material. The timing of the release function of the material feed mechanism is critical, as premature release may allow the material to move out of position too far for the pilot positioning pin to be effective. Alternatively, if the material feed mechanism releases the strip material too late or not at all, tension will be developed in the strip material when the pilot positioning pin enters the hole. This may cause hole deformation with resulting improperly positioned material. This improperly positioned material will cause the manufacture of malformed parts and can damage the pilot positioning pin as well as the die set.

Various methods of releasing the strip material from the material gripping mechanism are well known in the prior art. Typically, these methods utilize cams, air cylinders, or various other devices. Technology currently exists for both setting and maintaining precise material release mechanism timing between the material feed mechanism and the stamping press. For example, see U.S. Pat. No. 5,720,421. Furthermore, this technology provides for infinite variation in release timing, as well as a convenient means for adjusting this timing. However, no technology exists for determining the precise press slide or press mechanism position when the alignment device contacts the material and the material gripping mechanism release should occur.

Determining the precise point in the press stroke when the material feed mechanism should release its grip on the strip material is difficult due to two primary problems. First, the alignment device is typically located in a position which makes it difficult or impossible to visually inspect. Second, the nature of a flywheel driven mechanical stamping press makes it difficult to precisely position the press slide in small increments. The process of moving the press slide in small incremental movements is called "inching" or "jogging" and is accomplished by repeated engagement of the press clutch for short periods of time. This causes a motion that is very erratic and makes it difficult to precisely position the press slide, in order to verify the correct position of the alignment device relative to the strip material. The difficult nature of the current methods is best illustrated by example.

Current methods exist for determining and setting the correct material release mechanism timing, but these methods typically require the press operator to locate the material in the die in a position which will allow the punching of the initial locating hole. The operator must then effect movement of the press ram, to close the die, punching the locating hole in the material. The material is then progressed a single progression, thereby positioning the material correctly to allow the alignment device to contact the material on a subsequent closure of the die. The operator then "inches" or "bars" the press to the point at which the material alignment device begins to contact the material. The point at which the material alignment device begins contact with the material is determined visually or, alternatively, by grasping the material in hand, moving or trying to move the material, and feeling for resistance to movement of the material provided by the alignment device. Having determined the press position where the material alignment device begins to contact the material, the operator then adjusts the material feed mechanism to release the hold on the material at this point or slightly before this point in the press stroke. This process is then repeated and adjustments are made until proper timing of the material release mechanism is verified.

SUMMARY OF THE INVENTION

It is, therefore, an object of the present invention to provide a method for determining the correct timing of the material release mechanism. It is another object of the present invention to provide a method for setting the correct timing of the material release mechanism. It is a further object of the present invention to provide an automated system for accurately determining release mechanism timing. It is a still further object of the present invention to provide a method and apparatus that is capable of disengaging contact with a material immediately prior to engagement by an alignment device.

The present invention includes a method for determining the correct timing of a material release mechanism of a material feed mechanism, including the steps of: (1) cycling a press mechanism through a working portion of a tooling mechanism; (2) monitoring the press mechanism position; (3) determining, by a location device, the desired timing for the material release mechanism to release contact with the material; and (4) correlating the desired material release mechanism timing to the press mechanism position. In another embodiment, the method also includes the step of adjusting the timing of the material release mechanism to the determined desired material release mechanism timing.

The present invention is also directed to a stamping system for working a material. This stamping system includes a press mechanism configured to punch holes in the material. The stamping system also includes a material feed mechanism having a material release mechanism for feeding material to the tooling mechanism, and a location device for monitoring the press mechanism position in determining a desired material release mechanism timing.

The present invention, both as to its construction and its method of operation, together with additional objects and advantages thereof, will best be understood from the following description of specific embodiments when read in connection with the accompanying drawings.

DETAILED DESCRIPTION OF THE PREFERRED EMBODIMENTS

Figure 1:
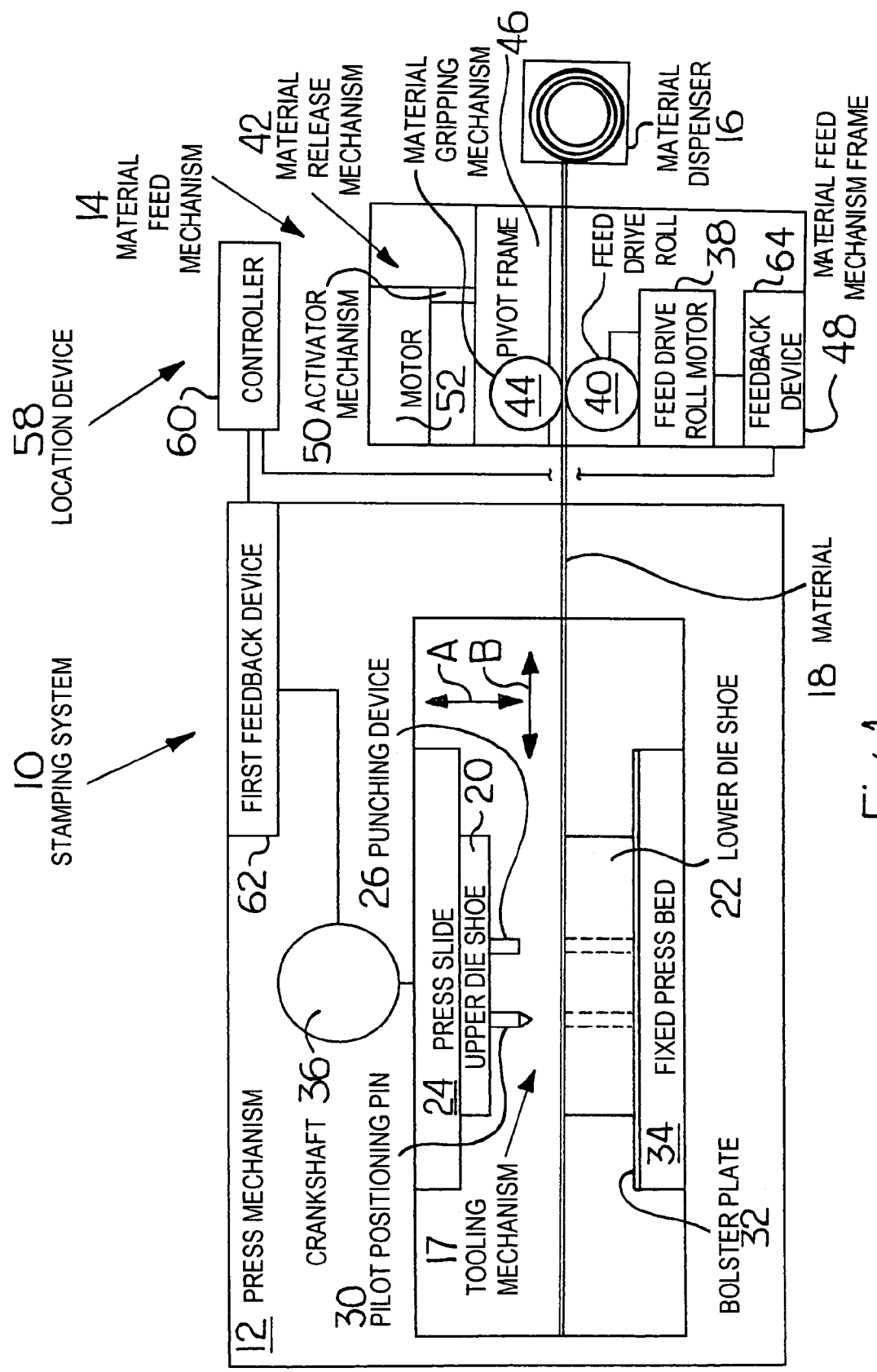
FIG. 1 is a side schematic view of a stamping system according to the present invention.
Figure 2:
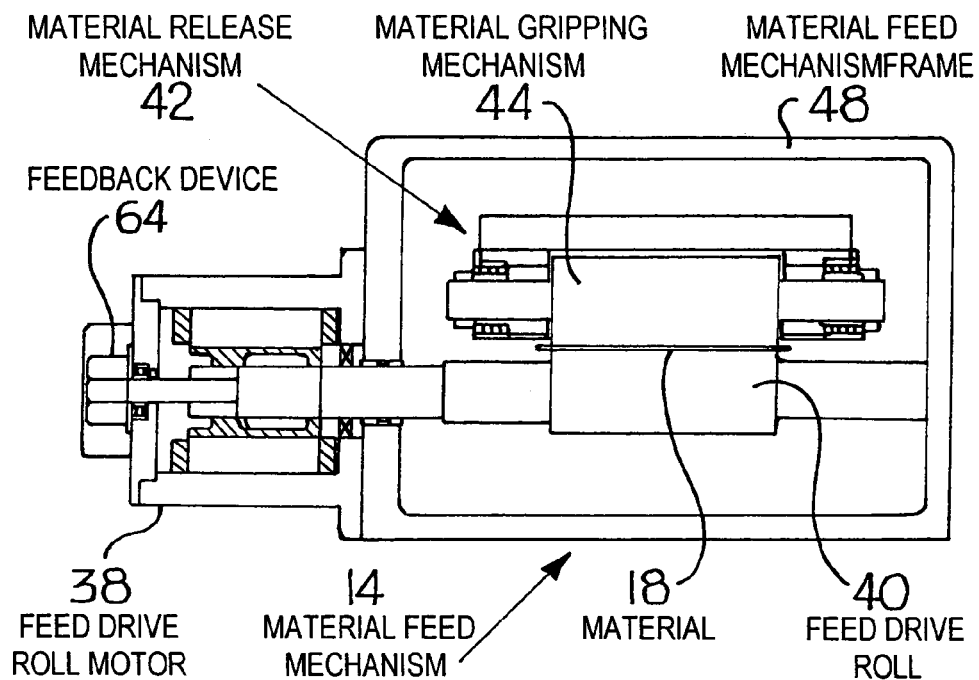
FIG. 2 is a front view of a material feed mechanism of the stamping system in FIG. 1.
Figure 3:
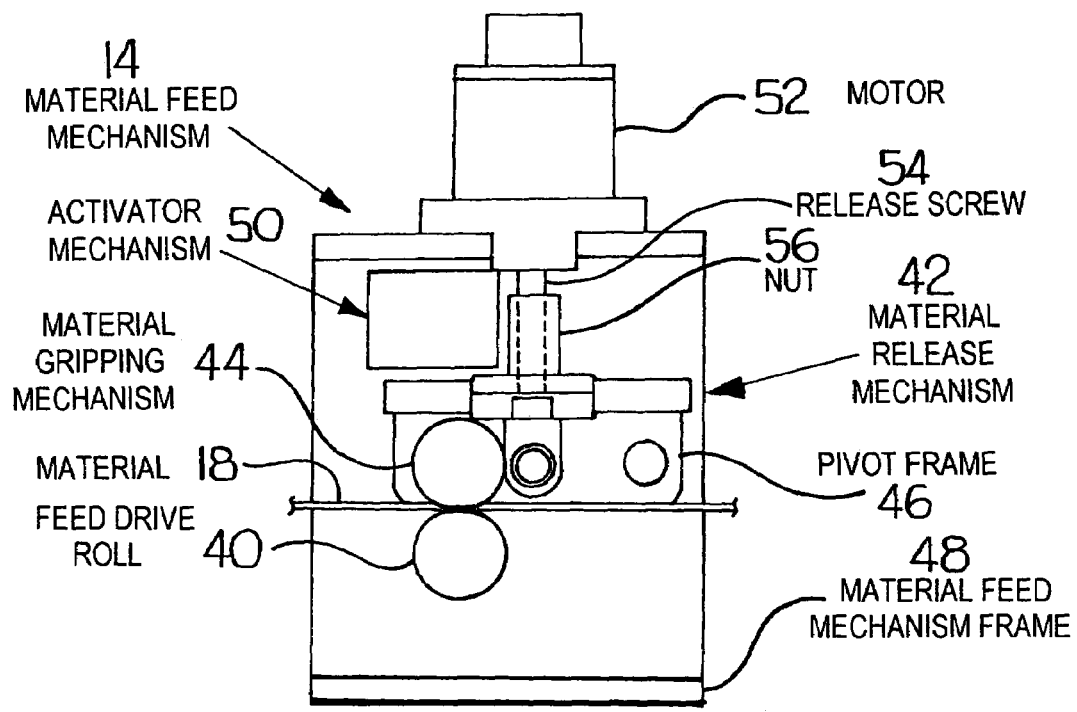
FIG. 3 is an edge view of the material feed mechanism in FIG. 2.

As illustrated in FIGS. 1-3, the present invention is directed to a stamping system 10, which includes a press mechanism 12, a material feed mechanism 14 and a material dispenser 16. The material feed mechanism 14 is used to feed an elongated strip of material 18 from the material dispenser 16 through the material feed mechanism 14 and into the press mechanism 12. This press mechanism 12 typically includes a tooling mechanism 17 having an upper die shoe 20 and lower die shoe 22. The upper die shoe 20 is mounted to a press slide 24 in the press mechanism 12. The upper die shoe 20 of the tooling mechanism 17 has a punching device 26 and an alignment device 28 mounted on its underside. The punching device 26 is constructed so that it is capable of punching the material 18. In the preferred embodiment, the alignment device 28 is a pilot positioning pin 30. As discussed above, this upper die shoe 20 is mounted to the press slide 24 which, in turn, moves up and down in relation to the lower die shoe 22. The lower die shoe 22 of the tooling mechanism 17 is mounted to a bolster plate 32 rigidly mounted to a fixed press bed 34.

The material 18, typically, but not exclusively, in the form of a continuous strip, is fed to and moves between the upper die shoe 20 and the lower die shoe 22. Further, the press mechanism 12 also includes a driver having a crankshaft 36 to drive or move the press slide 24 towards and away from the lower die shoe 22, as represented by arrow A. As detailed in FIGS. 1-3, the material feed mechanism 14 includes a feed drive roll motor 38, typically a servo motor, to power and drive the feed drive roll 40, which advances the material 18 through the material feed mechanism 14.

A material release mechanism 42 includes a material gripping mechanism 44, which works along with the feed drive roll 40 to grip the material 18. Typically, this material gripping mechanism 44 is a secondary drive roll. The material gripping mechanism 44 is mounted in a pivot frame 46, which is pivotably mounted to a material feed mechanism frame 48. The material release mechanism 42 also includes an actuator 50, typically pneumatic, capable of applying downward pressure on the pivot frame 46, thereby allowing the material gripping mechanism 44 to grip the material 18 between the material gripping mechanism 44 and the feed drive roll 40.

As seen in FIG. 3, it is also envisioned that the material feed mechanism 14 includes a motor 52 to drive a release screw 54, which mates with a nut 56, for effecting the movement of the pivot frame 46 against the force of actuator 50. It is this release screw 54 and nut 56 arrangement which allows the material gripping mechanism 44 to move away from the feed drive roll 40, thereby releasing the grip pressure on the strip material 18.

In order to determine a desired material release mechanism timing, the stamping system 10 also includes a location device 58. In the preferred embodiment, this location device 58 includes a controller 60 that monitors the press mechanism 12 position and determines the desired timing for the material release mechanism 42 to release contact with the material 18. Further, this controller 60 can perform the correlation between the desired material release mechanism 42 timing to the press mechanism 12 position. It is also envisioned that the location device 58 include a first feedback device 62 to monitor, collect and transmit information regarding the press mechanism 12, as well as its parts, to the controller 60. Similarly, a second feedback device 64 may be used to monitor, collect and transmit information regarding the material feed mechanism 14, and its parts, to the controller 60.

In a preferred embodiment, the location device 58 uses the first feedback device 62 to monitor the crankshaft 36 of the press mechanism 12. Next, this first feedback device 62 communicates the angular position information of the crankshaft 36 to the controller 60. The second feedback device 64 is mounted to the feed drive roll motor 38 and is used to monitor and communicate the angular position of the feed drive roll motor 38 to the controller 60. Finally, the controller 60 computes position error information based on the required motion of the feed drive roll motor 38, and the measured actual motor angular position. Controller 60 may also compute the required torque command for the feed drive roll motor 38, based on the position error information computed above. This torque command is sent to the motor 38. Also, the required torque commands, by definition, may be used and/or referred to as the measured torque of the motor 38. Although the location device 58 has been described as monitoring the specific equipment discussed above, it is envisioned and discussed in greater detail hereinafter, that this location device 58 may be used to monitor and determine the desired material release mechanism 14 timing and press mechanism 12 position based upon any of the physical characteristics of the stamping system 10 parts and equipment, including the feed mechanism and the press itself.

Figure 5:
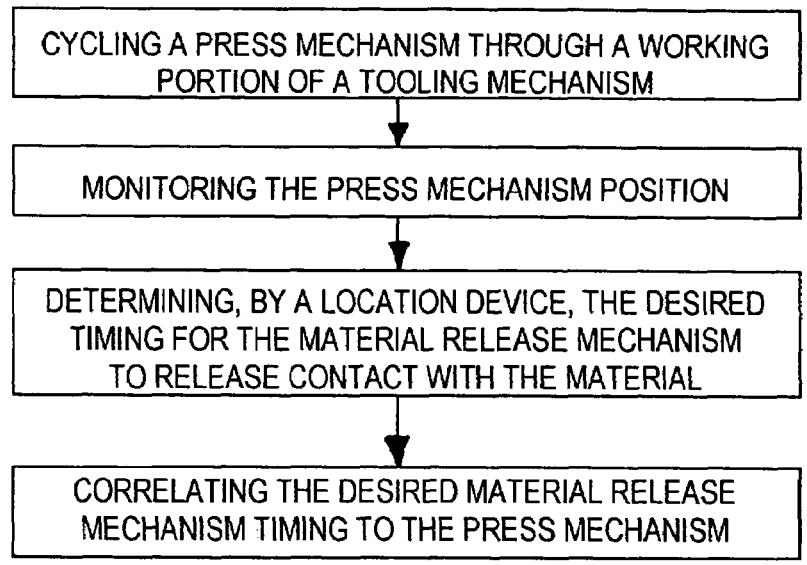
FIG. 5 is a flow diagram of a method according to the present invention.

As illustrated in FIG. 5, the present invention also includes a method for determining the correct timing of the material release mechanism 14. In order to determine this timing, the press mechanism 12 is cycled through the working portion of the alignment device 28 of the tooling mechanism 17. The press mechanism 12 position is monitored. The above-described location device 58 may be used to determine the desired timing for the material release mechanism. 42 to release contact with the material 18. Typically, the desired timing for release is immediately prior to contact with the material 18 by the alignment device 28, or in this embodiment, the pilot positioning pin 30. Next, the determined desired material release mechanism 14 timing is correlated to the press mechanism 12 position. Overall, this will allow the material release mechanism 42 to disengage the material 18, allow the pilot positioning pin 30 to contact the material 18 and align it, before the material gripping mechanism 44 again contacts the material 18 and the material feed mechanism 14 continues the feed. After the desired timing has been determined, the actual material release mechanism 42 timing may be adjusted to the determined desired material release mechanism 42 timing.

Figure 4:
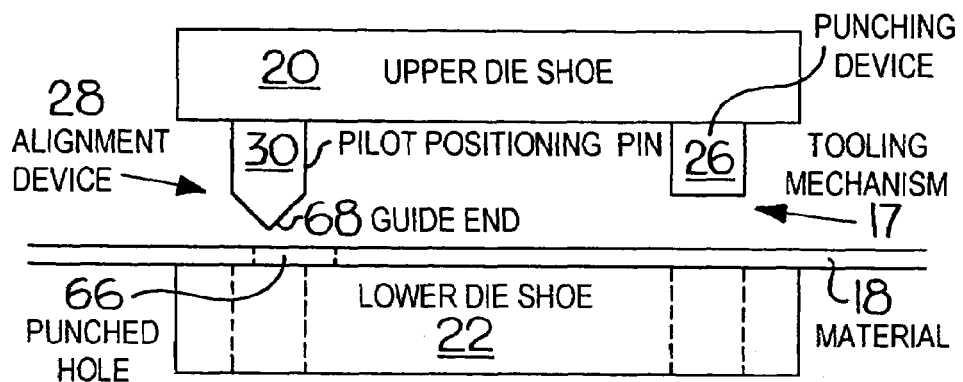
FIG. 4 is a side schematic view of a tooling mechanism according to the present invention.

In the preferred embodiment, the strip material. 18 is positioned with the leading edge through the first die station, containing the punching device 26. The press mechanism 12 is then cycled through one complete press stroke, with the punching device 26 piercing or punching a hole 66 into the strip material 18. The material 18 is then advanced by the material feed mechanism 14 a predetermined distance, short of the die progression. This will position the material 18, such that the pilot positioning pin 30 is located substantially above the previously punched hole 66, but slightly misaligned. This condition is illustrated in FIG. 4, with the misalignment greatly exaggerated. In practice, this misalignment is small, typically only 0.003 inches to 0.008 inches.

Figure 6:
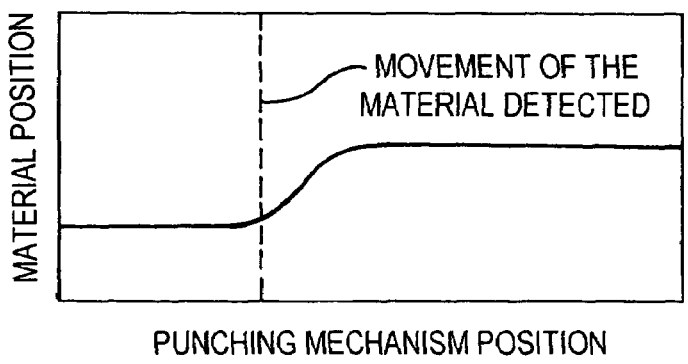
FIG. 6 is a graph of press mechanism position versus material position.

The next step is to cycle the press mechanism 12 through the working portion of the alignment device 28, and typically through a complete press stroke, while the controller 60 simultaneously monitors the position of the feed drive roll motor 38. When the upper die shoe 20 closes, the pilot positioning pin 30 enters the prepunched hole 66, and the material 18 is forced into a final aligned position. This causes movement of the material gripping mechanism 44 and the feed drive roll motor 38, which are gripping the material 18. When the press cycle is complete, the controller 60 analyzes the information gathered and correlates the movement of the material release mechanism 42 (including the material gripping mechanism 44) and the feed drive roll motor 38 to the position of the press mechanism 12, thereby determining the press mechanism 12 position where the pilot positioning pin 30 entered the strip 18. An example of this correlated data is shown in FIG. 6. Finally, the material feed mechanism 14, specifically the material release mechanism 42, is programmed to release the material 18 at the calculated press mechanism 12 position for subsequent press cycles. In this preferred embodiment, the controller 60 automatically sets the correct release point and stores the information for future use.

The pilot positioning pin 30 has a guide end 68, which is typically beveled. When the press mechanism 12 enters the working portion of the tooling mechanism 17, the guide end 68 of the pilot positioning pin 30 is partially engaged with the hole 66. Due to the misalignment, a side wall of the guide cud 68 contacts an inner edge of the hole 66, such that the material 18 is moved along a first axis (arrow B) as the side wall of the guide end 68 continues through the hole 66. The desired material release mechanism 42 timing is based upon the linear movement of the material 18 along this first axis B. Further, the linear movement of the material 18 along this first axis B after the guide end 68 has filly engaged the hole 66 may be measured. The linear movement of the material 18 may be correlated to the position of the press mechanism 12, to determine the desired material release mechanism 42 timing. It is also envisioned that the angular rotation of the feed drive roll 40 caused by the linear movement of the material 18 may be correlated to the position of the press mechanism 12, to determine the desired material release mechanism 42 timing. If the press mechanism 12 includes a press ram, the linear movement of the press ram position may be measured and correlated to the movement of the material 18, to determine the desired material release mechanism 42 timing.

It is also envisioned that the disturbance force produced upon contact of the pilot positioning pin 30 with the material 18 may be measured. As above, this measurement may be used to determine the desired material release mechanism 42 timing. The torque exerted upon the feed drive roll 40 after the guide end 68 of the pilot positioning pin 30 has fully engaged the hole 66 may also be measured. Similarly, the force exerted upon the material gripping mechanism 44 may be measured. These measurements may then be used to determine the desired material release mechanism 42 timing. Material 18 movement at the material dispenser 16 may also be measured and used to determine the desired material release mechanism 42 timing. The torque exerted upon the feed drive roll 40, the force exerted upon the material gripping mechanism 44, as well as the feed drive roll motor 38 position error may all be used to determine the desired material release mechanism 42 timing. It is envisioned that the controller 60, together with appropriate feedback devices (62, 64) may be used to monitor, transmit, and calculate the desired release mechanism 42 timing based upon any of these measurements.

Overall, the present invention is a stamping system 10 and method for determining and adjusting the desired timing of a material release mechanism 42. When using the controller 60, the present invention is an automated system, which eliminates the prior art guesswork previously used by operators to set the material release mechanism 42 timing. This, in turn drastically increases productivity and reduces both operator error and possible operator safety concerns.

The present invention determines the precise press mechanism 12 (typically the press slide 24) position when the alignment device 28 is about to contact the material 18 and the material release should occur. It is this precise point in the press stroke when the material feed mechanism 14 should release its grip on the strip material 18. This precise point, as described in detail above, is determined by the controller 60 based upon the linear or angular movements of certain components and subcomponents of the stamping system 10. However, it is also envisioned that one or more sensors can be used and positioned adjacent or in the vicinity of the punching device 26 or the alignment device 28. Such sensors could sense contact or exact positioning of the alignment device 28 and/or the punching device 26, and this information could be used to determine the material release mechanism 42 timing. For example, the contact of either the punching device 26 or the alignment device 28 could be sensed when an electrical circuit is complete, thereby determining the timing for material 18 release. Also, sensors could be used to directly measure the movement of material 18 to determine the timing of material 18 release. Alternatively, the material 18 could be mechanically dithered (or moved back and forth) as the alignment device 28 is entering the hole 66. Using the forward and backward contact of sidewalls of the guide end 68 of the pilot positioning pin 30, the controller 60 could determine the material release mechanism 42 timing.

Furthermore, although the aforementioned preferred embodiments reference feed drive roll 38 and/or drive rolls in the material feed mechanism 14 and the material gripping mechanism 44, it is envisioned that the material feed mechanism 14 could utilize sliding gripper(s) for advancing the strip material 18 and/or sliding or stationary gripper(s), as a part of the material feed mechanism 14 and/or the material gripping mechanism 44 and/or as a part of the material release mechanism 42.

This invention has been described with reference to the preferred embodiments. Obvious modifications and alterations will occur to others upon reading and understanding the preceding detailed description. It is intended that the invention be construed as including all such modifications and alterations.

We claim:

1. A method for determining the correct timing of a material release mechanism of a material feed mechanism for feeding elongated strip material, the method comprising the steps of:
    cycling a press mechanism through a working portion of a tooling mechanism;
    monitoring the press mechanism position;
    determining, by a location device having a controller, the desired timing for the material release mechanism to release contact with the material by sensing the contact of at least one component of the tooling mechanism with the material by:
        placing the material through the material release mechanism of the material feed mechanism;
        positioning the material with the leading edge through a first station of the tooling mechanism;
        punching a first hole in the first portion of the material with a punching device;
        incrementally advancing the material such that an alignment device having a guide end is located substantially above the first hole;
        contacting a side wall of the guide end of the alignment device with an inner edge of the first hole;
        measuring a disturbance force produced upon contact of the alignment device with the material; and
        determining the desired material release mechanism timing based upon the measured disturbance force; and
    correlating the desired material release mechanism timing to the press mechanism position.

2. The method of claim 1, wherein the material feed mechanism further includes at least one feed drive roll in frictional engagement with the material, the method further comprising the step of measuring the torque exerted upon the feed drive roll.

3. The method of claim 1, wherein the material feed mechanism further includes a material gripping mechanism in frictional engagement with the material, the method further comprising the step of measuring the force exerted upon the material gripping mechanism.

4. A method for determining the correct timing of a material release mechanism of a material feed mechanism for feeding elongated strip material, wherein the material feed mechanism includes at least one feed drive roll in frictional engagement with the material, the method comprising the steps of:
    cycling a press mechanism through a working portion of a tooling mechanism;
    monitoring the press mechanism position;
    determining, by a location device having a controller, the desired timing for the material release mechanism to release contact with the material by sensing the contact of at least one component of the tooling mechanism with the material by:
        placing the material through the material release mechanism of the material feed mechanism;
        positioning the material with the leading edge through a first station of the tooling mechanism;
        punching a first hole in the first portion of the material with a punching device;
        incrementally advancing the material such that an alignment device having a guide end is located substantially above the first hole;
        measuring the torque exerted upon the feed drive roll after the guide end of the alignment device has engaged the first hole; and
        determining the desired material release mechanism timing based upon the measured torque; and
    correlating the desired material release mechanism timing to the press mechanism position.

5. A method for determining the correct timing of a material release mechanism of a material feed mechanism for feeding elongated strip material, wherein the material release mechanism includes a material gripping mechanism in frictional engagement with the material, the method comprising the steps of:
    cycling a press mechanism through a working portion of a tooling mechanism;
    monitoring the press mechanism position;
    determining, by a location device having a controller, the desired timing for the material release mechanism to release contact with the material by sensing the contact of at least one component of the tooling mechanism with the material by:
        placing the material through the material release mechanism of the material feed mechanism;
        positioning the material with the leading edge through a first station of the tooling mechanism;
        punching a first hole in the first portion of the material with a punching device;
        incrementally advancing the material such that an alignment device having a guide end is located substantially above the first hole;
        measuring the force exerted upon the material gripping mechanism after the guide end of the alignment device has engaged the first hole; and
        determining the desired material release mechanism timing based upon the measured force; and
    correlating the desired material release mechanism timing to the press mechanism position.

* * * * *

UNITED STATES PATENT AND TRADEMARK OFFICE
CERTIFICATE OF CORRECTION

| | | |
|---|---|---|
| PATENT NO. | : 7,287,678 B2 | Page 1 of 1 |
| APPLICATION NO. | : 10/416945 | |
| DATED | : October 30, 2007 | |
| INVENTOR(S) | : Martin et al. | |

It is certified that error appears in the above-identified patent and that said Letters Patent is hereby corrected as shown below:

Column 5, Lines 55-56, "guide cud" should read -- guide end --

Column 5, Line 62, "has filly engaged" should read -- has fully engaged. --

Signed and Sealed this

Sixth Day of May, 2008

JON W. DUDAS
*Director of the United States Patent and Trademark Office*